United States Patent [19]
Ohsawa

[11] 3,872,393
[45] Mar. 18, 1975

[54] IF AMPLIFIER

[75] Inventor: Mitsuo Ohsawa, Fujisawa, Japan
[73] Assignee: Sony Corporation, Tokyo, Japan

[22] Filed: Nov. 26, 1973
[21] Appl. No.: 419,108

[30] Foreign Application Priority Data
Dec. 26, 1972 Japan ........ 48-833[U]

[52] U.S. Cl. ........ 330/30 D, 330/31
[51] Int. Cl. ........ H03f 3/68
[58] Field of Search ........ 330/29, 31, 30 D, 38 M, 330/69

[56] References Cited
UNITED STATES PATENTS 2,946,016 7/1960 Meyer ........ 330/69
3,509,369 4/1970 Crouse et al. ........ 330/30 D X
3,560,770 2/1971 Emmasingel ........ 330/30 D UX
3,646,458 2/1972 Verhoeven et al. ........ 330/30 D X
3,646,464 2/1972 Boggs ........ 330/30 D FOREIGN PATENTS OR APPLICATIONS
2,006,203 9/1970 Germany ........ 330/30 D

*Primary Examiner*—James B. Mullins
*Attorney, Agent, or Firm*—Hill, Gross, Simpson, Van Santen, Steadman, Chiara & Simpson

[57] ABSTRACT

An IF amplifier for FM radio receivers includes a differential amplifier in the final stage which has an IF tuning circuit for a load and an attenuator connected across the input circuit of the differential amplifier. The attenuator is provided to control the input signal applied to the differential amplifier in such a manner that the differential amplifier operates in a non-saturating condition to reduce the distortion ratio.

5 Claims, 3 Drawing Figures

IF AMPLIFIER

BACKGROUND OF THE INVENTION

1. Field of the Invention

This invention relates generally to an IF amplifier, and more particularly to an IF amplifier which includes a differential amplifier.

2. Description of the Prior Art

In the prior art, an IF output transistor has been employed for FM radio receivers which has an IF tuning circuit as a load, so that the tuning frequency of the IF tuning circuit changes when said IF output transistor operates in a saturation condition. Moreover, the change of the tuning frequency affects the S curve characteristics of a detector, and hence distortion is caused.

In order to avoid such a defect, a method has been known in the prior art in which an IF output transistor has an attenuating resistor in the base circuit thereof and operates in a non-saturating condition. However, this method has the drawback that its operation is unstable because of the increase of the input impedance, and the attenuating ratio is not enough to keep the transistor in a non-saturating condition.

Another method has also been known in the prior art in which an IF output transistor has a pair of diodes connected to the base circuit thereof, the diodes clamping the input signal at a predetermined value (± 0.6V). With this method, there has not been used an output transistor which has a small voltage gain, and hence it is difficult to remove the aforesaid drawbacks.

Further, a method has been also known in the prior art in which an IF output transistor has a resistor in the emitter circuit thereof to produce a current feedback for reducing the voltage gain thereof to about 4 db. However, this method has the drawback that since the input and output impedances of the IF output transistor increase, it is hard to design a satisfactory IF tuning circuit.

SUMMARY OF THE INVENTION

It is a main object of this invention to provide an improved IF amplifier which is free from the aforementioned drawbacks encountered in the prior art.

It is another object of this invention to provide an IF amplifier in which a differential amplifier is used for the IF output stage.

It is a further object of this invention to provide an IF amplifier which has a differential amplifier used as the IF output stage and an attenuator connected to the base circuit of a transistor of the differential amplifier and operates in non-saturation condition.

DESCRIPTION OF THE PREFERRED EMBODIMENTS

Figure 1:
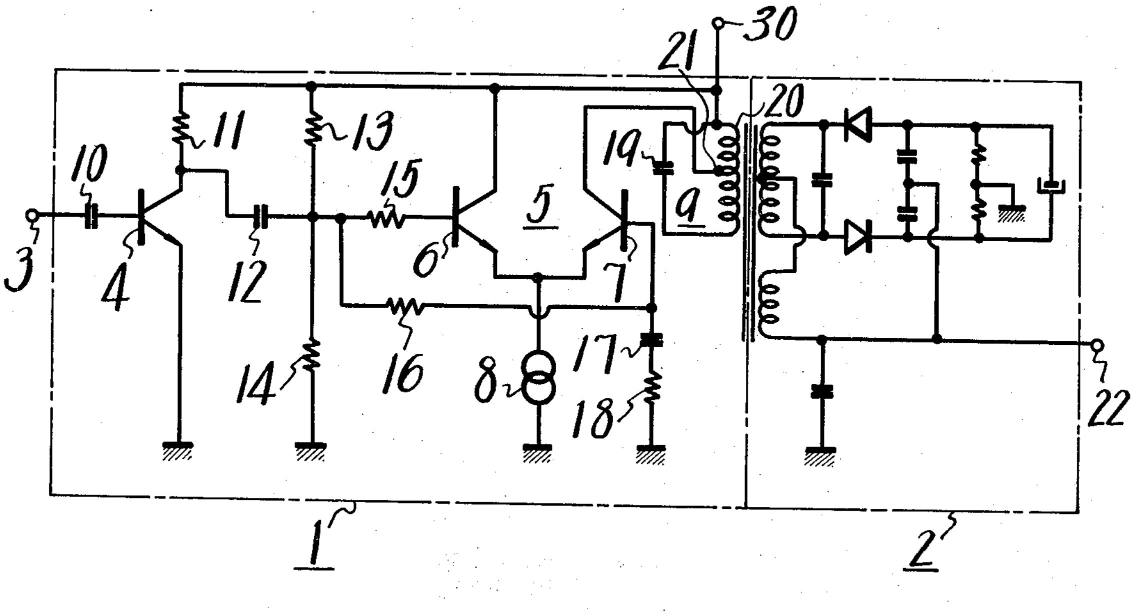
FIG. 1 is a circuit diagram showing an embodiment of the IF amplifier according to this invention.

In the preferred embodiment of the present invention illustrated in FIG. 1, the broken box 1 indicates generally an IF the broken box 2 an FM detector circuit generally. An input terminal 3 is connected through a capacitor 10 to the base electrode of a first stage transistor 4, the collector electrode of which is connected through a load resistor 11 and an IF tuning circuit 9 to a power source terminal 30, while the emitter electrode thereof is grounded. The collector electrode of the transistor 4 is further connected through a coupling capacitor 12 and a resistor 15 to a differential amplifier 5 which is provided as a final IF stage amplifier. The differential amplifier 5 consists of a pair of transistors 6 and 7, the emitter electrodes of which are connected together and grounded through a constant current source 8, while the collector electrodes thereof are connected through the IF tuning circuit 9 to the power source 30. The IF tuning circuit 9 consists of a capacitor 19 and an inductor coil 20 connected in parallel to the capacitor 19 and having a mid-tap 21. The collector electrode of the transistor 6 is connected to one end of the inductor coil 20 and the collector electrode of the other transistor 7 is connected to the mid-tap 21 of the coil 20. One end of the coil 20 is connected to the power source 30. Thus, the IF tuned circuit 9 is formed as a balanced type load. The base electrode of the transistor 6 is connected through the resistor 15 to the connection point between resistors 13 and 14 which are connected between the power source 30 and the ground, while the base electrode of the transistor 7 is grounded through a series connection of a capacitor 17 and a resistor 18 and also connected to the connection point between the resistors 13 and 14 through a resistor 16. The resistors 16 and 18 serve to set the gain of the differential amplifier 5 at a predetermined value and the resistor 16 also serves as a base bias resistor for the transistor 7. The resistor 15 acts as a resistor for attenuating a signal applied to the differential amplifier 5, so that it can be dispensed with, if necessary.

The FM detector circuit 2 is coupled to the output side of the IF tuning circuit 9 and a detected output signal is delivered to its output terminal 22. Since a well known circuit is used as the FM detector circuit 2 in this example, its description will be omitted for the sake of brevity.

A description will now be made of the operation of the circuit shown in FIG. 1. When an IF signal is fed to the input terminal 3, it is amplified by the first stage transistor 4. Since the first stage transistor 4 is formed as a capacity coupled type, even if it has saturation characteristics due to its limiting operation, no problem will be presented to the deterioration of the distortion ratio. The output signal from the transistor 4 is applied through the capacitor 12 and the resistor 15 to the base electrode of the transistor 6 of the differential amplifier 5.

Figure 3:
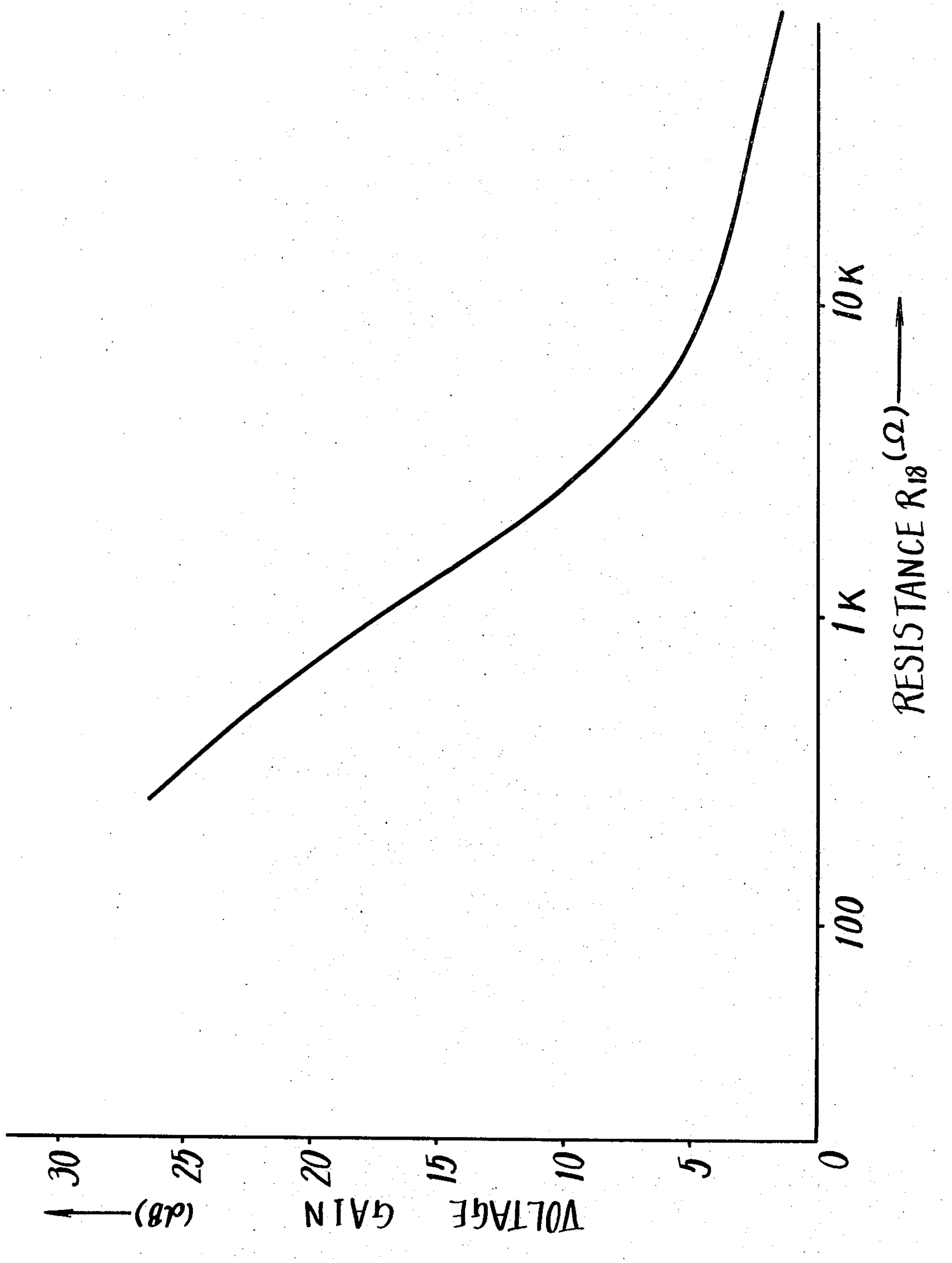
FIG. 3 is a graph showing the voltage-gain characteristics of an IF output transistor used in the invention.

In general, the differential amplifier 5 has no gain for an input signal of the same phase but has gain for a differential input signal only. Accordingly, if the value of the resistors 16 and 18 is selected suitably, the gain of the differential amplifier 5 can be made aas shown by a curve in FIG. 3 in which the abscissa represents the resistance value $R_{18}$ in ohms (Ω) of the resistor 18, the ordinate represents the voltage gain of the differential amplifier 5 in db and the resistance value of the resistor 16 is taken as constant. As may be apparent from FIG. 3, as the resistance value $R_{18}$ of the resistor 18 becomes high, the voltage gain of the differential amplifier 5 becomes low. For the input signal applied to the input terminal 3, the output voltage derived from the transistor 4 is generally saturated at about 2 volts and the output voltage from the differential amplifier 5 is saturated at about 3 to 4 volts, so that the gain of the differential amplifier 5 is desired to be set smaller than 4db.

With the invention, the resistance value of the resistors 16 and 18, which may attenuate the input signal to the differential amplifier 5, is selected so as to set the gain of the differential amplifier 5 to be about 4db and hence to prevent the differential amplifier 5 from being saturated, so that the deterioration of the distortion ratio is avoided.

Further, with the invention, since the input signal to the differential amplifier 5 is controlled to suppress its gain, the output impedance thereof is prevented from being increased and hence the IF tuning circuit 9 can be constructed easily.

Further, in the invention since the final stage is formed as a differential amplifier 5, the IF amplifier can be easily formed as an IC circuit, and also since the IF tuning circuit 9 is formed as a balanced type load, an AC signal will not be leaked externally.

Figure 2:
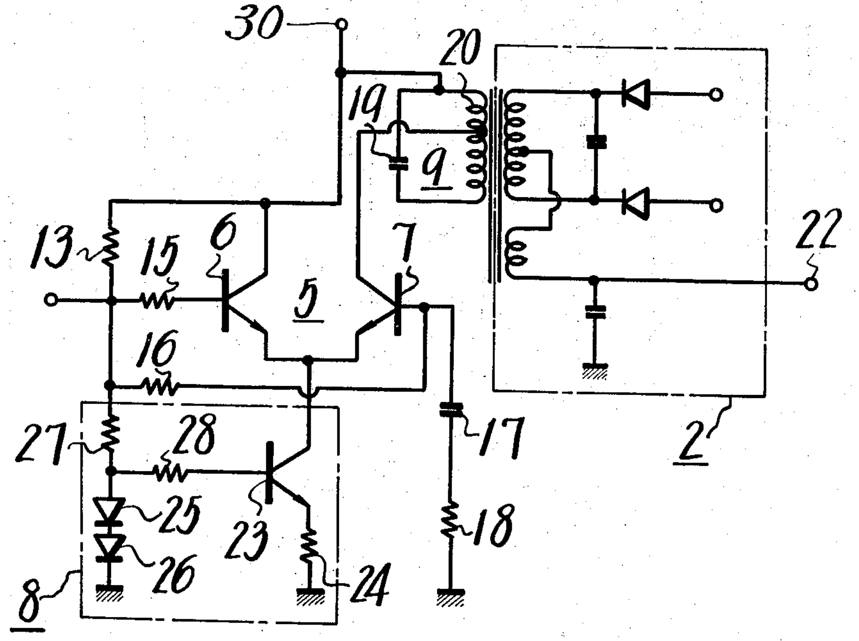
FIG. 2 is a circuit diagram showing another embodiment of the IF amplifier of this invention.

FIG. 2 is a circuit diagram for showing a part of the example shown in FIG. 1, especially a practical embodiment of the constant current source 8. The constant current source 8 of this example includes a transistor 23 whose emitter electrode is grounded through a resistor 24 and whose collector electrode is connected to the connection point between the emitter electrodes of the transistors 6 and 7 of the differential amplifier 5, a pair of diodes 25 and 26 connected in series, and a resistor 27. The base electrode of the transistor 23 is connected to the connection point between the resistor 27 and the diode 25 through a resistor 28. The end of the resistor 27 opposite to that which is connected to resistor 28 is connected to the connection point between the resistors 15 and 16. The free end of the diode 26 is grounded.

An IF amplifier using the circuit element shown in FIG. 2 operates similar to that of FIG. 1, so that its description will be omitted for the sake of brevity.

It will be apparent that many modifications and variations could be made by those skilled in the art without departing from the spirit and scope of the novel concepts of the present invention.

I claim as my invention:

1. An IF amplifier comprising:

a. a voltage source;

b. a differential amplifier having first and second transistors whose emitter electrodes are connected to each other and to a voltage reference point through a common emitter impedance and whose collection electrodes are connected to the voltage source through a signal output means, a base electrode of said first transistor being supplied with an input signal, said differential amplifier being used as an IF final stage to which a frequency discriminator is connected;

c. attenuating means consisting of first and second resistors and a first capacitor, said first resistor being connected between the base electrodes of said first and second transistor, said second resistor and first capacitor are connected in series between a base electrode of said second transistor and voltage reference point respectively, said means being of a value to keep the differential amplifier in non-saturating condition.

2. An IF amplifier according to claim 1, wherein the signal output means includes a tuning circuit.

3. An IF amplifier according to claim 2, which further includes a thrid transistor whose output terminal is connected to the base electrode of said first transistor, said third transistor being operative in a saturation condition to obtain a limiter effect.

4. An IF amplifier according to claim 2, wherein said tuning circuit comprises an LC resonance circuit which is connected to the collector electrodes of the first and second transistors as an unbalanced type load.

5. An IF amplifier according to claim 1, wherein said common emitter impedance comprising a constant current source.

* * * * *